United States Patent
Tsorng et al.

(10) Patent No.: US 10,674,621 B1
(45) Date of Patent: Jun. 2, 2020

(54) COMMON USER CARRIER FOR DIFFERENT TYPES OF CARDS

(71) Applicant: QUANTA COMPUTER INC., Taoyuan (TW)

(72) Inventors: Yaw-Tzorng Tsorng, Taoyuan (TW); Chun Chang, Taoyuan (TW); Hsin-Chieh Lin, Taoyuan (TW); Guan-Ming Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/352,406

(22) Filed: Mar. 13, 2019

Related U.S. Application Data

(60) Provisional application No. 62/785,103, filed on Dec. 26, 2018.

(51) Int. Cl.
   *H05K 1/14* (2006.01)
   *H05K 5/02* (2006.01)
   *H05K 7/14* (2006.01)
   *H05K 5/03* (2006.01)
   *H05K 7/20* (2006.01)

(52) U.S. Cl.
   CPC ......... *H05K 5/0291* (2013.01); *H05K 5/0213* (2013.01); *H05K 5/0221* (2013.01); *H05K 5/0295* (2013.01); *H05K 5/03* (2013.01); *H05K 7/1487* (2013.01); *H05K 7/1489* (2013.01); *H05K 7/20163* (2013.01)

(58) Field of Classification Search
   USPC ........................................................ 361/737
   See application file for complete search history.

(56) References Cited

U.S. PATENT DOCUMENTS

| | | | |
|---|---|---|---|
| 5,780,365 A | 7/1998 | Nogami | |
| 5,940,288 A * | 8/1999 | Kociecki | H05K 7/20727 361/688 |
| 6,819,567 B2 * | 11/2004 | Baker | G11B 33/126 165/80.4 |
| 8,102,662 B2 * | 1/2012 | Hiew | H05K 5/0278 361/752 |
| 9,125,318 B2 * | 9/2015 | French, Jr. | H05K 7/1489 |
| 9,448,597 B2 * | 9/2016 | Cox | G06F 1/181 |
| 9,867,306 B2 * | 1/2018 | Cheng | H05K 7/1418 |
| 2012/0250279 A1 | 10/2012 | Harashima et al. | |

(Continued)

FOREIGN PATENT DOCUMENTS

EP    1069812 A2    1/2001

OTHER PUBLICATIONS

Extended European Search Report for EP Application No. 19192013.1, dated Feb. 21, 2020.

*Primary Examiner* — Hung S. Bui
(74) *Attorney, Agent, or Firm* — Nixon Peabody LLP; Zhou Lu

(57) ABSTRACT

A common carrier for different device cards for installation in a server is disclosed. The common carrier has a base module that includes side walls and a bottom panel. The bottom panel has a plurality of registration features, each of the registration features corresponding to one of a plurality of different device cards. A top cover includes side walls that is assembled with the base module. A device card of the plurality of different device cards is positioned between the base module and the top cover by at least one of the registration features.

17 Claims, 8 Drawing Sheets

(56) References Cited

U.S. PATENT DOCUMENTS

| | | | |
|---|---|---|---|
| 2013/0141851 A1* | 6/2013 | Yang | G06F 1/183 |
| | | | 361/679.02 |
| 2014/0085805 A1* | 3/2014 | Xu | G06F 1/183 |
| | | | 361/679.33 |
| 2016/0212863 A1 | 7/2016 | Yin et al. | |
| 2016/0270266 A1* | 9/2016 | Ozawa | H05K 7/20754 |

* cited by examiner

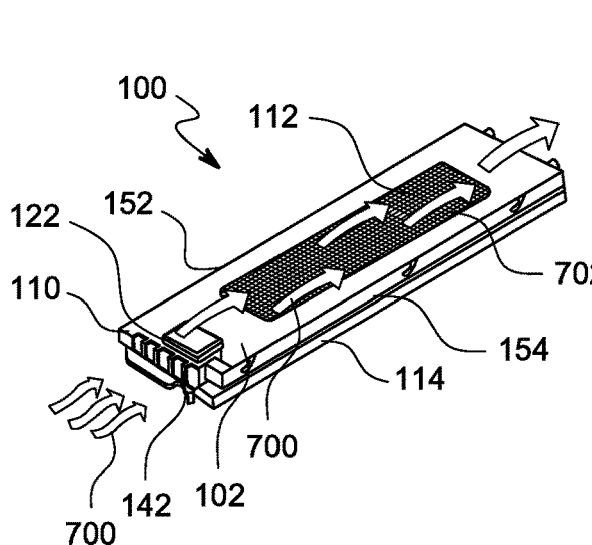
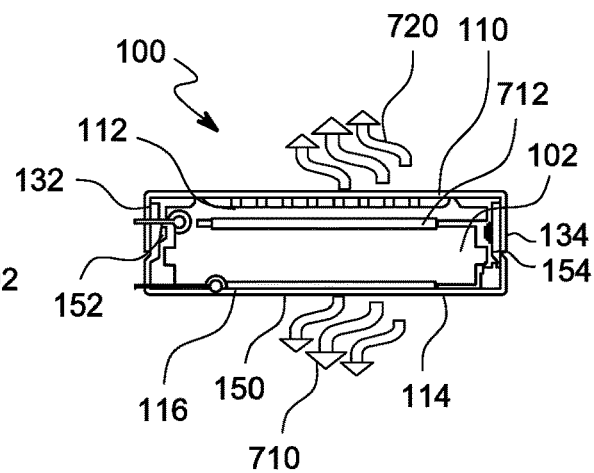
FIG. 7A    FIG. 7B
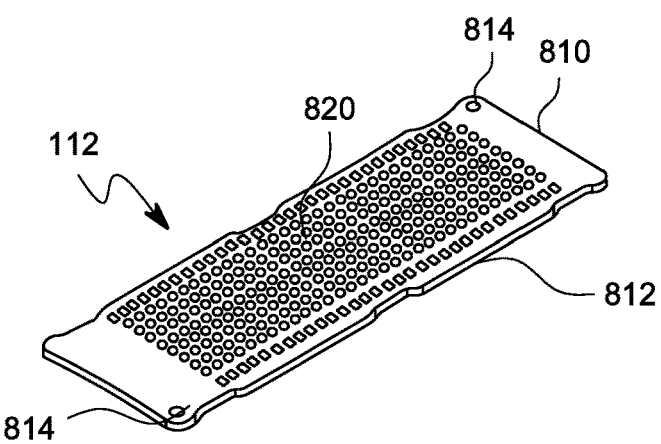
FIG. 8A
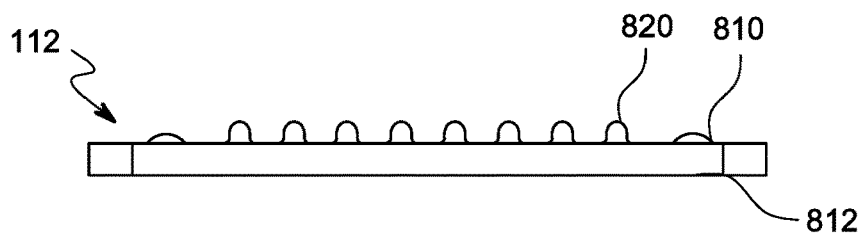
FIG. 8B
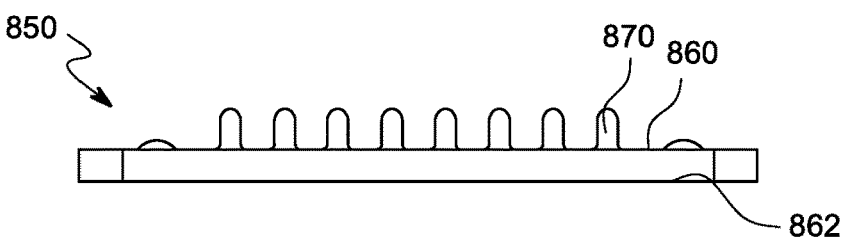
FIG. 8C

US 10,674,621 B1

COMMON USER CARRIER FOR DIFFERENT TYPES OF CARDS

PRIORITY CLAIM

This application claims priority under 35 U.S.C. § 119 to U.S. Provisional Application No. 62/785,103, filed on Dec. 26, 2018. The contents of that application are hereby incorporated by reference in their entirety.

TECHNICAL FIELD

The present disclosure relates generally to a carrier for cards that may be inserted into modular slots in a server. More particularly, aspects of this disclosure relate to an integrated carrier that may support different types of cards.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller. Current server design includes a large number of slots that accept device cards that may be plugged in to perform server functions. For example, a storage server may include numerous solid state drive (SSD) device cards while a processing server may include more device cards with processing units.

Servers generate enormous amounts of heat due to the operation of internal electronic devices such as controllers, processors, and memory as well as the components on such device cards. Thus, servers are designed to rely on air flow through the interior of the device to carry away heat generated from electronic components. Carriers for device cards often have heat sinks to draw heat away from electronic components generating heat on the cards. Heat sinks are typically composed of thermally conductive material. Heat sinks absorb the heat from the electronic components, thus transferring the heat away from the components. The challenge of heat removal increases with each generation of card devices, as each generation becomes more powerful, thereby generating more heat.

As explained previously, storage servers may include SSD device cards. The current generation of SSD cards are based on the M.2 form factor standard. Thus, carriers are specifically designed to hold the M.2 form factor. However, an NF1 card form factor design has recently been introduced. The NF1 card is a larger form factor that allows for drives with double the capacity of M.2 SSDs. The M.2 mechanical specification has a top side component area that is approximately 22 mm by 110 mm with a golden finger type connector at one end. The next generation storage cards are generally larger. For example, the NF1 mechanical specification has a top side component area that is approximately 30.50 mm by 110 mm with a different golden finger type connector at one end. This card is aimed primarily at data-intensive analytics and virtualization applications that require higher performance and capacity than what M.2 based card devices can provide. Another more current SSD card form factor design is based on the newly introduced E1S form factor.

FIG. 1A shows a prior art server 10 having slots for carriers for E1S form factor SSD device card. The server 10 includes a chassis 12 that includes a front end 14 that includes numerous slots 16 to accommodate E1S form factor device cards. FIG. 1A shows several E1S form factor cards 20 and associated carriers inserted in the slots 16. FIG. 1A shows a carrier 30 that is removed from one of the slots 16. The carrier 30 contains a E1S form factor SSD device card 32. The carrier 30 includes a latch 34 that may be pivoted between a locked and unlocked position to hold the carrier 30 in the slot 16. Additional screws (not shown) are required to secure the card 32 to the carrier 30 in the slot 16.

FIG. 1B shows two prior art NF1 form factor SSD device cards 50 in specific carriers 60. As may be seen in FIG. 1B, the NF1 cards include various electronic components 52. The SSD cards 50 includes an interconnection tab 54 that provides electrical connections to a socket mounted in the server. The carrier 60 includes a latch 62 that may be pivoted between a locked and unlocked position. Additional screws (not shown) are required to secure the card 50 to the carrier 60 in a matching slot for a server.

The different NF1 and E1S form factor dimensions creates a problem for server manufacturers. As new card device modules have developed, the NF1 and E1S type cards have become widely used. Both styles of cards are available, but the footprint for each card differs from each other. Thus, servers must be configured to receive only one of these two types of cards. Thus, no proper generic carrier may fit next generation storage cards such as the NF1 and E1S cards concurrently.

Since the footprints of the current respective carriers for the NF1 and E1S cards are different, a server may only accommodate one specific carrier for either an E1S or an NF1 card form factor. Thus, an operator cannot provide a server that is based on devices mounted on both types of cards. Further, each card is mounted by screws to the respective carrier and thus tools are required to replace cards in each type of carrier. Since such cards include more advanced components, relative heat generated from such components is greater than past cards. However, there is no extra thermal solution for carriers for each card, and as such, both types of cards are limited by the lack of cooling in their respective carrier.

Thus, there is a need for a single common carrier which may be used for both E1S and NF1 type cards. There is another need for a toolless mechanism to mount a card in a common carrier. There is also a need for a carrier with more efficient heat dissipation for higher power device cards.

SUMMARY

One disclosed example is a carrier for a device card for installation in a server. The carrier has a base module including side walls and a bottom panel. The bottom panel has a plurality of registration features, each of the registration features corresponding to one of a plurality of different device cards. The carrier includes a top cover having side walls. A card of the plurality of different device cards is positioned by one of the registration features between the side walls of the base module and the top cover.

Another disclosed example is a server including a plurality of device modules. The server has a cage defining a plurality of module slots and a plurality of stop features corresponding to a plurality of different device cards. The server has a board with sockets corresponding to each of the module slots. A plurality of device modules is inserted in the module slots. Each device module includes a carrier that includes a base module having side walls, a bottom panel, and a top cover including side walls. The bottom panel has a plurality of registration features, each of the registration features corresponding to one of a plurality of different device cards. Each device module includes a device card selected from the plurality of different device cards. The device card is positioned between the side walls of the base module and the top cover by one of the registration features. The device card includes a connector connected to one of the sockets. The device card contacts with one of the plurality of stop features.

Another disclosed example is a device module for insertion in a server cage. The module includes a carrier with a base module having side walls, a bottom panel, and a top cover including side walls. The bottom panel has a plurality of registration features, each of the registration features corresponding to one of a plurality of different device cards. The device module also includes a device card selected from the plurality of different device cards. The device card is positioned between the side walls of the base module and the top cover by one of the registration features. The device card includes a connector extending from a distal end of the carrier.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 7A is a partial cutaway perspective view of the example common carrier that shows the air flow through the example common carrier;

FIG. 7B is a cross section view of the example common carrier showing venting of heat from the card;

FIG. 8A is a perspective view of the heat sink in the example common carrier; and FIG. 8B is a cross section of the heat sink in FIG. 8A; and FIG. 8C is a cross section of an improved heat sink that allows better thermal dissipation in comparison with the heat sink in FIG. 8B.

Figure 1A:
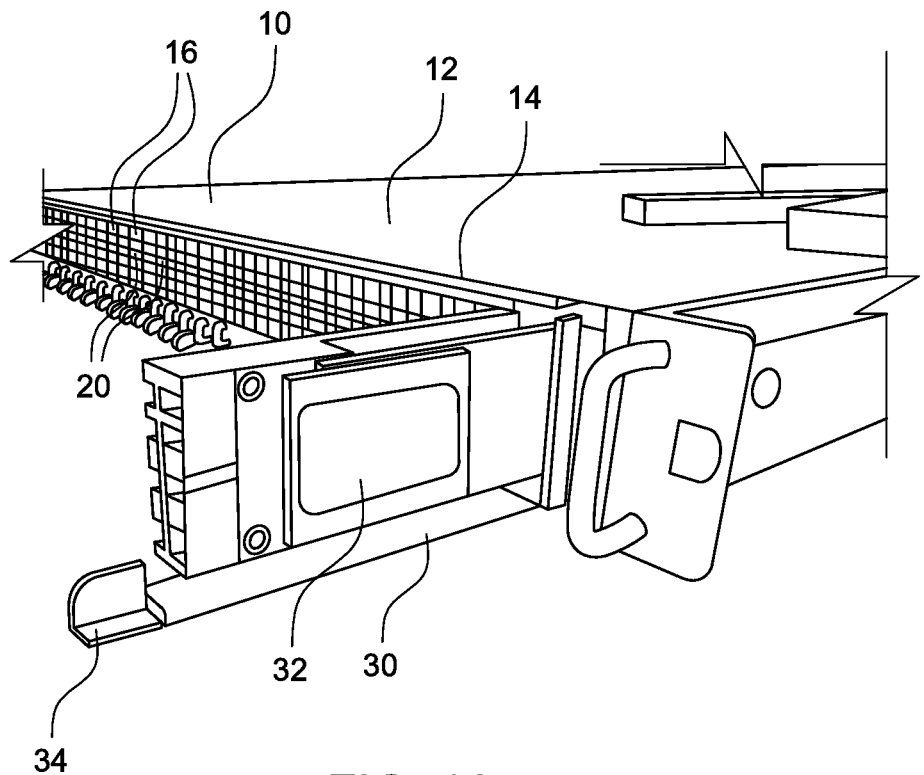
FIG. 1A shows a prior art server having a series of solid state drive cards based on the E1S form factor and their respective carriers.
Figure 1B:
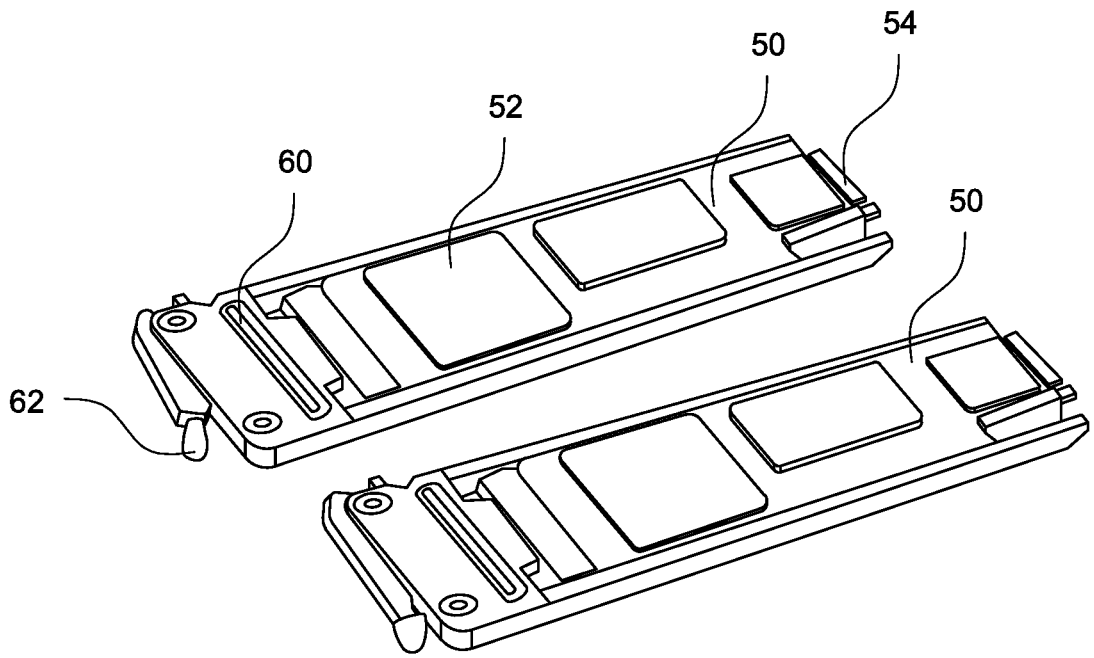
FIG. 1B shows prior art solid state drive cards based on the NF1 form factor and their respective carriers.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward an example carrier that may support different types of form factor cards, such as E1S and NF1 form factor device cards. The E1S and NF1 form factors are next generation storage cards which currently have no common carrier that allows both to be fitted. These next generation storage cards are generally larger than current cards. For example, the NF1 mechanical specification has a top side component area that is approximately 30.50 mm by 110 mm with a different golden finger type connector at one end. The disclosed common carrier therefore may be commonly used for E1S and NF1 form factor cards. The carrier therefore will accommodate cards having different footprints. The disclosed common carrier is a toolless design for easy assembly and service thereby eliminating the need for screws and other mechanisms requiring tools for assembly. The common carrier has a foolproof design to prevent the improper insertion of an incompatible card or an improper orientation of the carrier to a server. An optimal cooling solution may be provided for a higher power card by increasing the surface area of a heat sink in the disclosed example carrier.

Figure 2A:
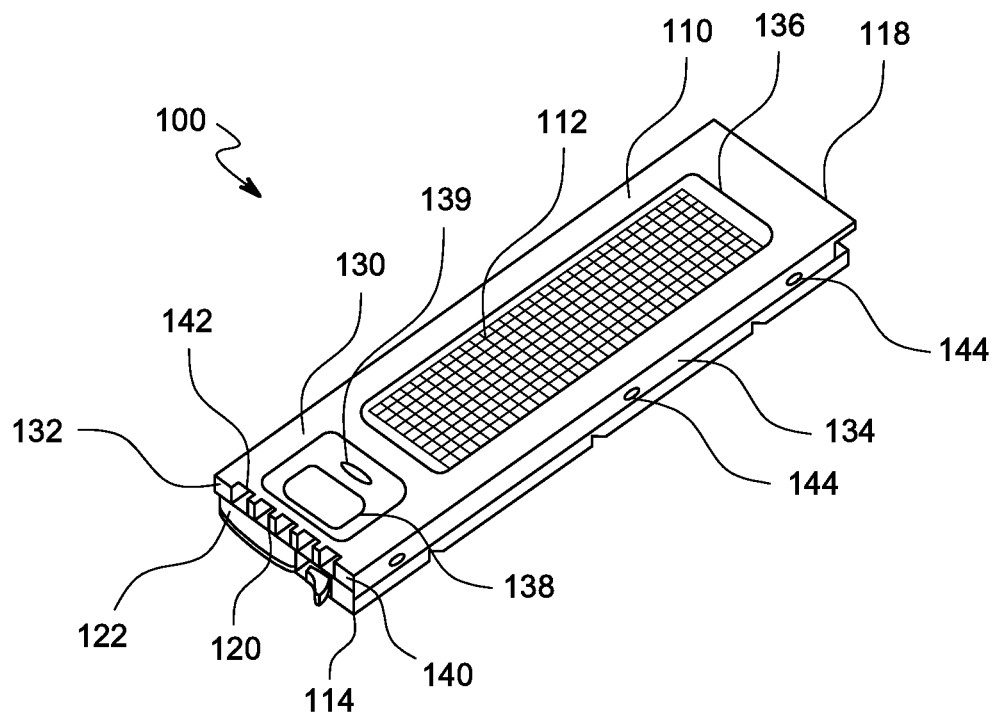
FIG. 2A is a front perspective view of the example common carrier for different types of cards.
Figure 2B:
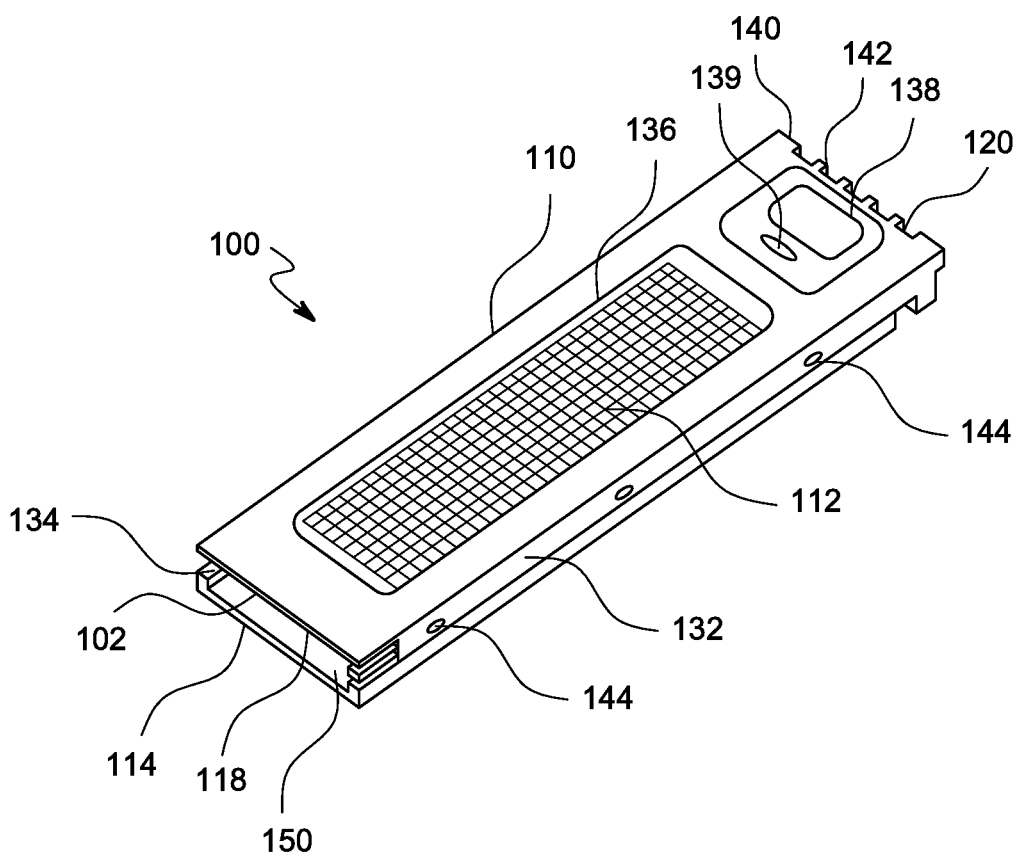
FIG. 2B is a rear perspective view of the example common carrier for different types of cards.
Figure 3A:
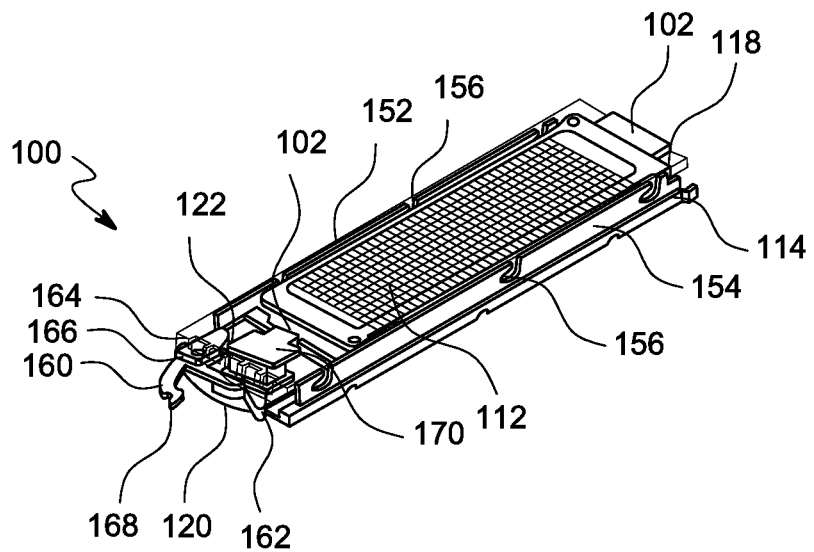
FIG. 3A is a cutaway perspective view of the example common carrier in FIG. 2A with an installed card.
Figure 3B:
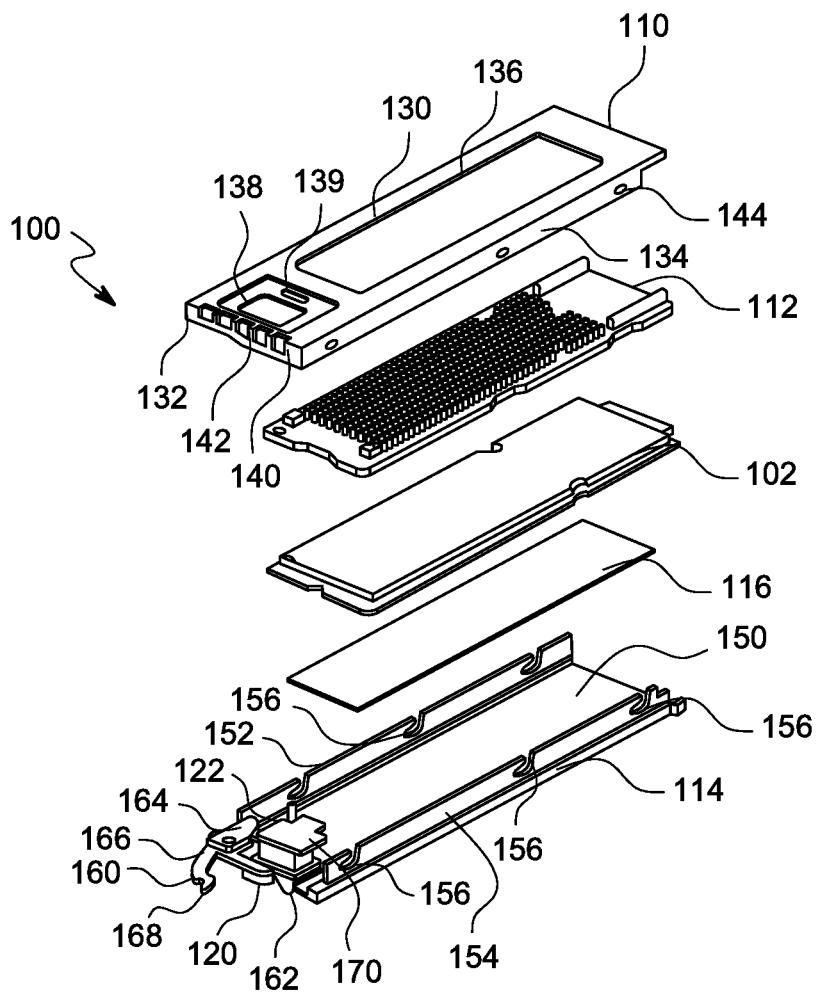
FIG. 3B is an exploded perspective view of the example common carrier in FIG. 2A with an installed card.

FIG. 2A is a front perspective view of the example common carrier 100 for accommodating different types of cards. FIG. 2B is a rear perspective view of the example common carrier 100. FIG. 3A is a cutaway view of the assembled components of the example common carrier 100, and FIG. 3B is an exploded perspective view of the components of the example common carrier 100. The common carrier 100 may hold a variety of different cards, one of which may be a device card 102 such as an SSD card as will be explained below. The carrier 100 is designed to hold the device card 102. The carrier 100 and the device card 102 form a device module that may be inserted into the cage of a server.

As may be seen in FIGS. 2A-2B and 3A-3B, the carrier 100 includes a top cover 110, a heat sink 112, and a base module 114. The top cover 110 is attached to the base module 114 to enclose a card device such as the card device 102, as well as the heat sink 112 and a thermal pad 116. The top cover 110 and the base module 114 form a distal connector end 118 and a proximal end 120. The proximal end 120 includes a latching mechanism 122 that allows that carrier 100 to be locked into place with a card slot in a server.

The top cover 110 includes a top panel 130 that is attached to two side walls 132 and 134. A roughly rectangular aperture 136 that extends almost the length of the top cover 110 is formed in the top panel 130. The aperture 136 exposes the heat sink 112 to allow dissipation of heat generated by the card 102. The top panel 130 of the top cover 110 also includes an access aperture 138 that is located near the proximal end 120. The access aperture 138 allows access to the latching mechanism 122. A locking slot 139 is located distal from the access aperture 138 that allows the latching mechanism 122 to hold the top cover 110 in place. An edge 140 of the top cover 110 joins the ends of the side walls 132 and 134. The edge 140 forms the proximal end 120 and includes a series of vents 142 that allow additional air flow to the encased card. Each of the walls 132 and 134 include pins 144 that allow the top cover 110 to be attached to the base module 114 without using a tool.

The base module 114 includes a bottom panel 150 that is attached to two side walls 152 and 154. One end of the bottom panel 150 forms the proximal end 120. The latching mechanism 122 is mounted near the proximal end 120. Each of the walls 152 and 154 include slots 156 that mate with the corresponding pins 144 of the walls 132 and 134 of the top cover 110. The pins 144 and slots 156 allow for tool less assembly of the base module 114 and the top cover 110. The thermal pad 116 is positioned on the bottom panel 150 under the card 102. As shown in the FIG. 3A, the heat sink 112 is placed over the card 102. The top cover 110 is then assembled to the base module 114, to hold the card 102. When assembled, the side walls 132 and 134 of the top cover 110 fit over the outside of the respective side walls 152 and 154 of the base module 114 as shown in FIG. 3A. Other arrangements for the interaction of the side walls of the top cover 110 and the base module 114 may be used. For example, the side walls of the base module 114 may overlap the side walls of the top cover 110.

As shown in FIGS. 3A-3B, the latching mechanism 122 includes a lever 160, a lever latch 162 and a lever spring 164. The lever 160 includes a locking end 166 that includes a tab that mates with a slot on a server cage to keep the carrier 100 in place when the lever 160 is in a locked position. An opposite catch end 168 of the lever 160 contacts the lever latch 162 to keep the lever 160 in the locked position. A pivot between the locking end 166 and the catch end 168 provides an axis of rotation for the lever 160 to move between the locked position and an unlocked position. The lever 160 may be unlocked by moving the lever latch 162 to release the catch end 168 of the lever 160. The lever spring 164 forces the lever 160 to pivot into the unlocked position. The unlocked position of the lever 160 is shown in FIGS. 3A-3B. The latching mechanism 122 also includes a touch surface point 170 that is accessible through the access aperture 138. When the touch surface point 170 is pressed down, the top cover 110 may be pushed forward toward the base module 114. The pins 144 will engage the slots 156 and the top cover 110 will be locked in place with the base module 114 by a lock feature attached to the touch surface point 170.

Figure 4A:
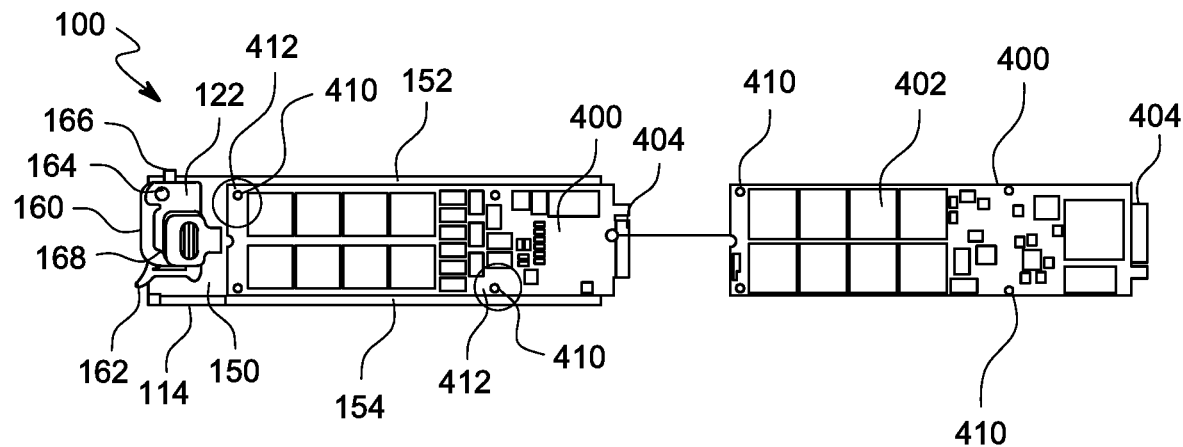
FIG. 4A is a cutaway view of the example common carrier with a NF1 type form factor card.

The example carrier 100 may be inserted in a server and allows for holding different types of cards that may be connected to the server once the carrier 100 is inserted. For example, FIG. 4A shows a top view of the base module 114 of the carrier 100 with a NF1 type form factor card 400. As shown in FIG. 4A, the NF1 form factor card 400 is inserted between the side walls 152 and 154 on the thermal pad 116 (not shown), which is placed on the bottom panel 150 of the base module 114.

The NF1 type form factor card 400 includes electronic components 402. One end of the card 400 includes a connector tab 404 that is connected to a socket in the server for providing electrical connections to the card 400. The connector tab 404 extends out from the distal end 118 of the carrier 100 (shown in FIG. 2A-2B) for mating with a socket in a server. The card 400 includes mounting holes 410 that may be attached to a registration feature, such as pins 412 on the bottom panel 150 of the base module 114. In this example, one of the pins 412 is located near one end of the side wall 154. The other pin 412 is located proximate the opposite end of the side wall 152. Of course, different pins may be used and different numbers of pins and corresponding holes in different locations may be used to position the card 400 relative to the base module 114. Of course other registration features such as screws may be used to properly position the specific type of card.

Figure 4B:
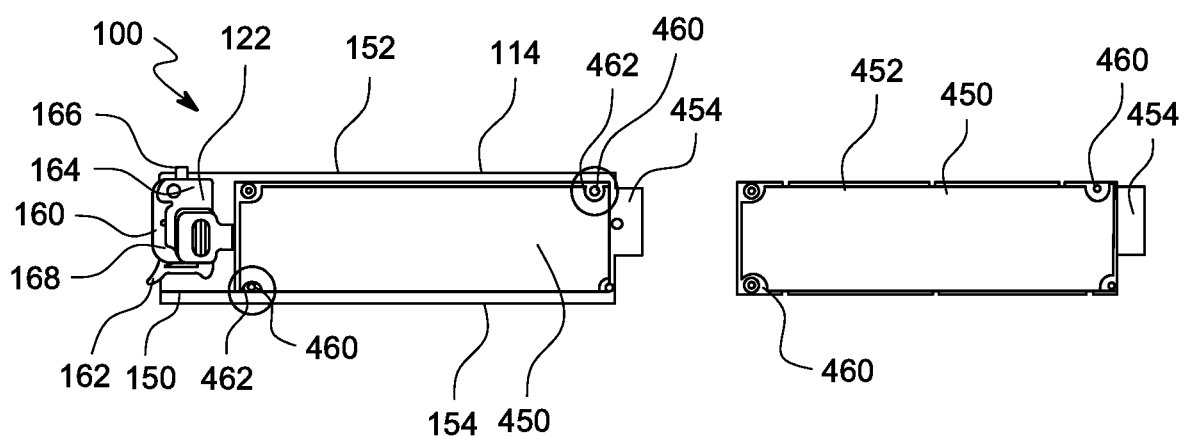
FIG. 4B is a cutaway view of the example common carrier with a E1S type form factor card.

FIG. 4B is a cutaway view of the example common carrier 100 in FIGS. 2A-3B with an E1S type form factor card 450. The E1S type form factor card 450 includes electronic components 452. One end of the card 450 includes a connector tab 454 that is connected to a socket in the server for providing electrical connections to the card 450. The connector tab 454 extends out from the distal end 118 of the carrier 100 (shown in FIG. 2A-2B) for mating with a socket in a server. The card 450 includes mounting holes 460 near each of the corners of the card 450. The mounting holes 460 may be attached to a second set of registration features such as pins 462 on the bottom panel 150 of the base module 114. In this example, one of the pins 462 is located near one end of the side wall 152. The other pin 462 is located near the opposite end of the other side wall 154. Of course, different pins may be used, and different numbers of pins and corresponding holes in different locations may be used to position the card 450 relative to the base module 114. It is to be understood that different sets of registration features may be provided on the base module 114 to accommodate different types of cards.

As may be seen in both FIGS. 4A and 4B, when the NF1 card 400 or the E1S card 450 is attached to the base module 114, the lever 160 of the latching mechanism 122 may be positioned in the locked position. The locking end 166 of the lever 160 is extended out and engages a slot in the server cage to keep the carrier 100 in place. The connector tab 404 or 454 of the respective cards 400 and 450 extend out from the distal end 118 of the carrier 100 and are inserted in corresponding sockets in the server. The lever latch 162 contacts the catch end 168 of the lever 160, and thus the lever 160 is forced against the lever spring 164 to the locked position.

Figure 5A:
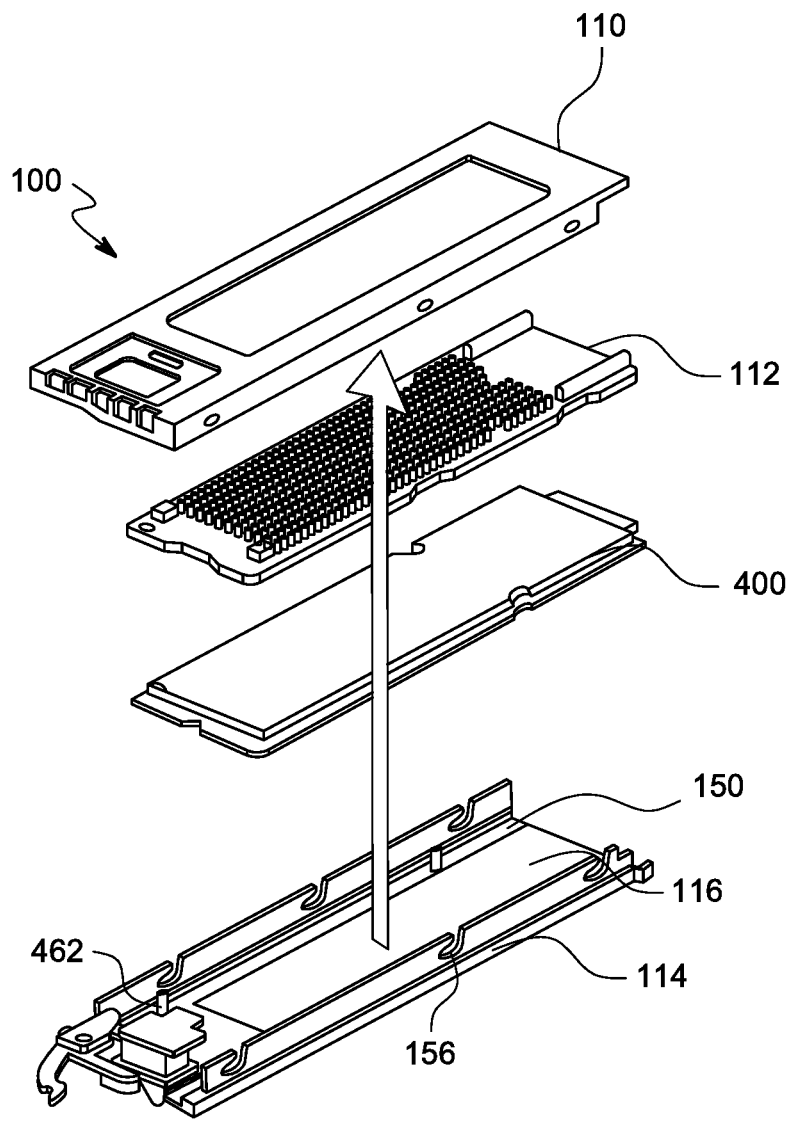
FIGS. 5A-5C show the assembly of the example common carrier and a device card.
Figure 5B:
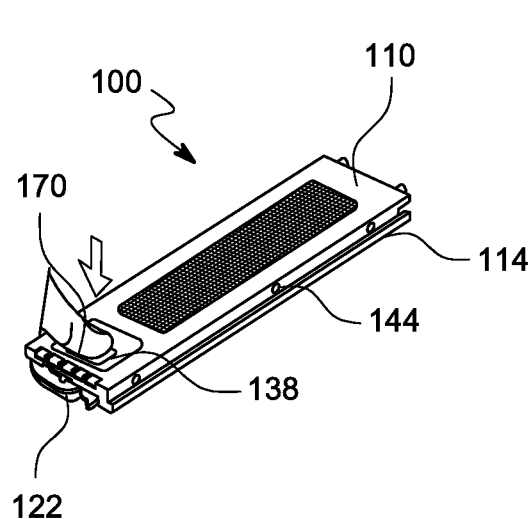
Figure 5C:
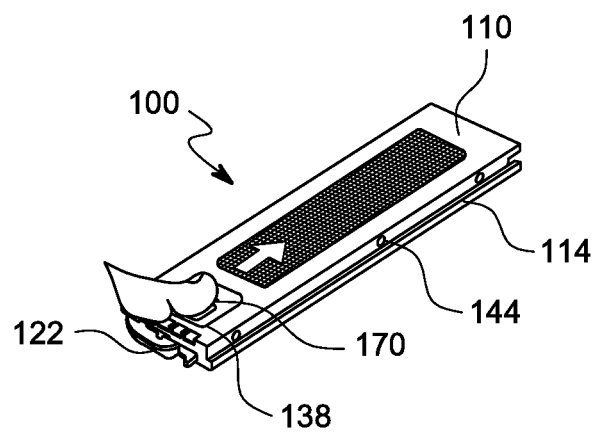

FIG. 5A-5C shows the sequence of assembly of the example carrier 100 and the E1S card 450. FIG. 5A shows the assembly of the base module 114, thermal pad 116, E1S card 450, heat sink 112 and top cover 110. The thermal pad 116 is placed on the bottom plate 150 in the base module 114. The E1S card 450 is then inserted on the thermal pad 116 in the base module 114. As explained above, the E1S card 450 has various holes that are placed on pins 462 extending from the bottom plate 150 of the base module 114. In this manner, the E1S card 450 is correctly aligned in the base module 114. The heat sink 112 is placed on the E1S card 450. Another thermal pad may be placed between the card 450 and the heat sink 112 to improve thermal conductivity. The top cover 110 is then inserted over the base module 114 creating an assembly as shown in FIG. 5B. Once the top cover 110 is inserted over the base module 114, the touch surface point 170 will extend through the access aperture 138.

As shown in FIGS. 5B and 5C, a user may press the touch surface point 170 while moving the top cover 110 over the base module 114 until the pins 144 of the top cover 110 engage the slots 156 of the base module 114. When the top cover 110 is moved into final position over the base module 114, the top cover 110 is locked in place via locking mechanism shown in FIGS. 5D and 5E.

Figure 5D:
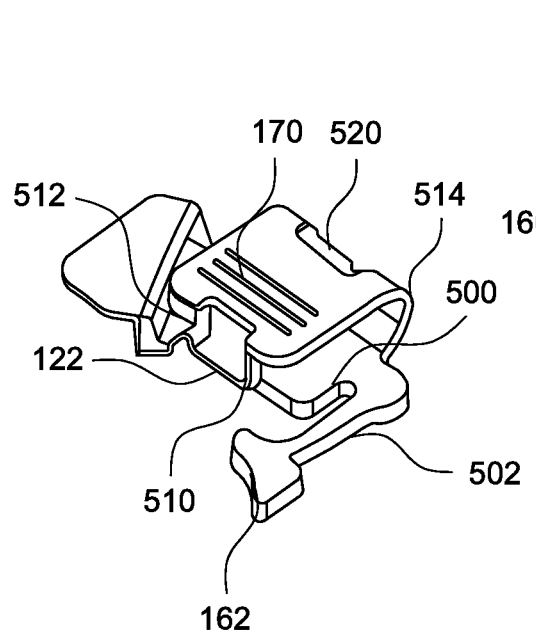
FIG. 5D is a close-up perspective view of the release mechanism on the example common carrier.
Figure 5E:
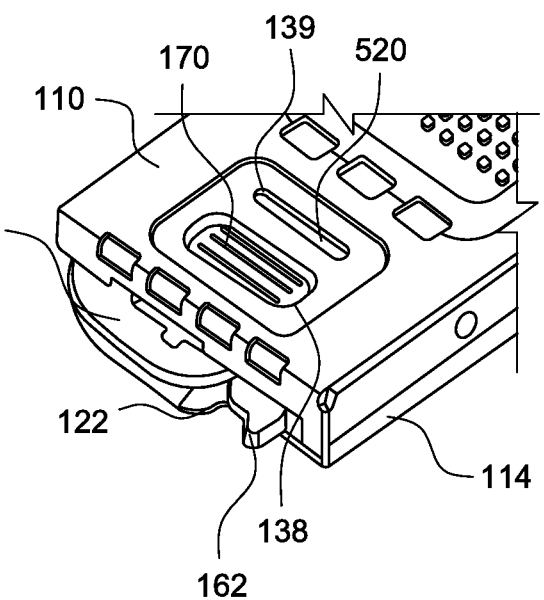
FIG. 5E is a close-up perspective view of the release mechanism when the example common carrier is assembled.

FIG. 5D shows a close-up perspective view of the latching mechanism 122 and touch surface point 170. FIG. 5E shows a close-up perspective view of the latching mechanism 122 when the top cover 110 is mated with the base module 114. As may be seen in FIG. 5D, the latching mechanism 122 includes a base panel 500 that forms an arm 502 that supports the lever latch 162. The touch surface point 170 is connected to the base panel 500 via two pins 510 and 512. The touch surface point 170 is also attached to the base panel 500 via a hinge 514. A lateral tab 520 extends from the distal end of the touch surface point 170.

As may be seen in FIG. 5E, when the top cover 110 is in proper alignment with the base module 114, the touch surface point 170 is accessible through the aperture 138. The lever 160 extends from the top cover 110 and the base module 114 to allow a user to engage the lever 160 with the lever latch 162 to lock the carrier 100 in place. The lateral tab 520 extends from the slot 139 and serves to hold the top cover 110 in place. When a user desires to remove the top cover 110, the user may press touch surface point 170. This causes the lateral tab 520 to retract and the top cover 110 may be pulled out from the base module 114.

Figure 6A:
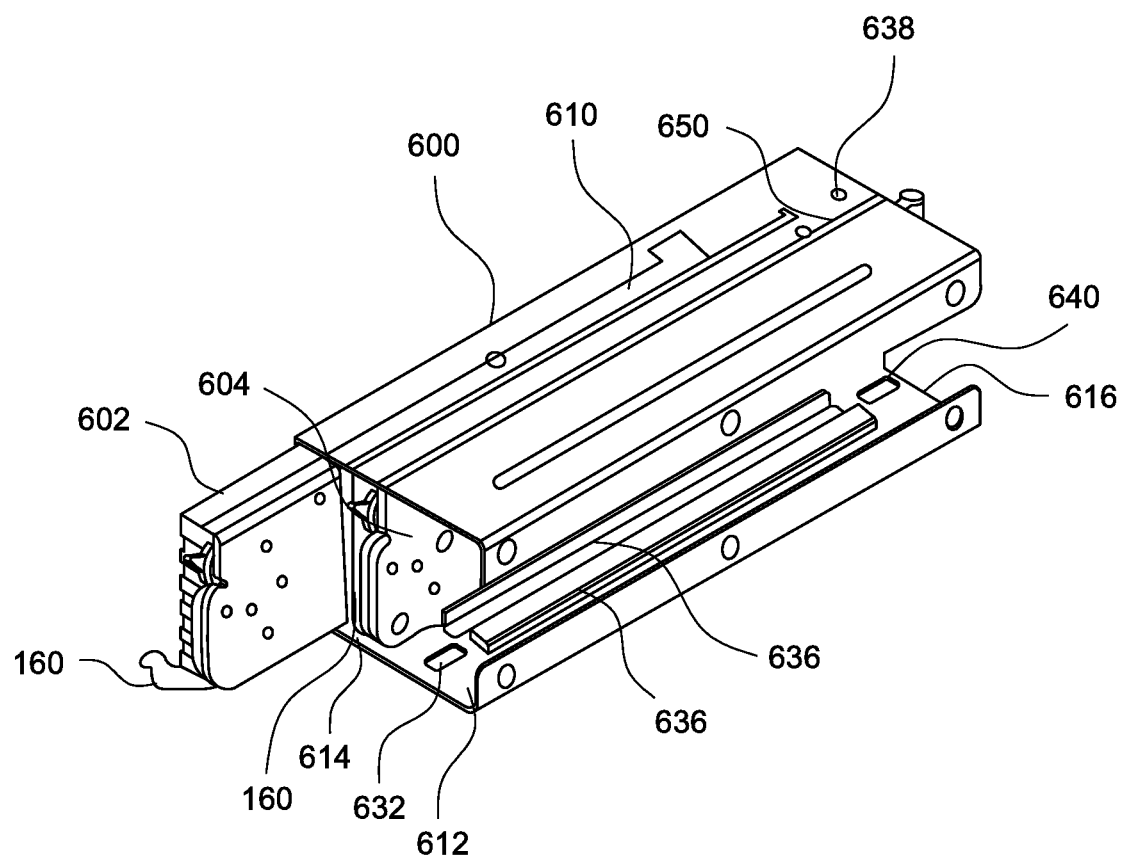
FIG. 6A is a perspective view of a cage in a server that includes slots for the example carrier in FIG. 2A.
Figure 6B:
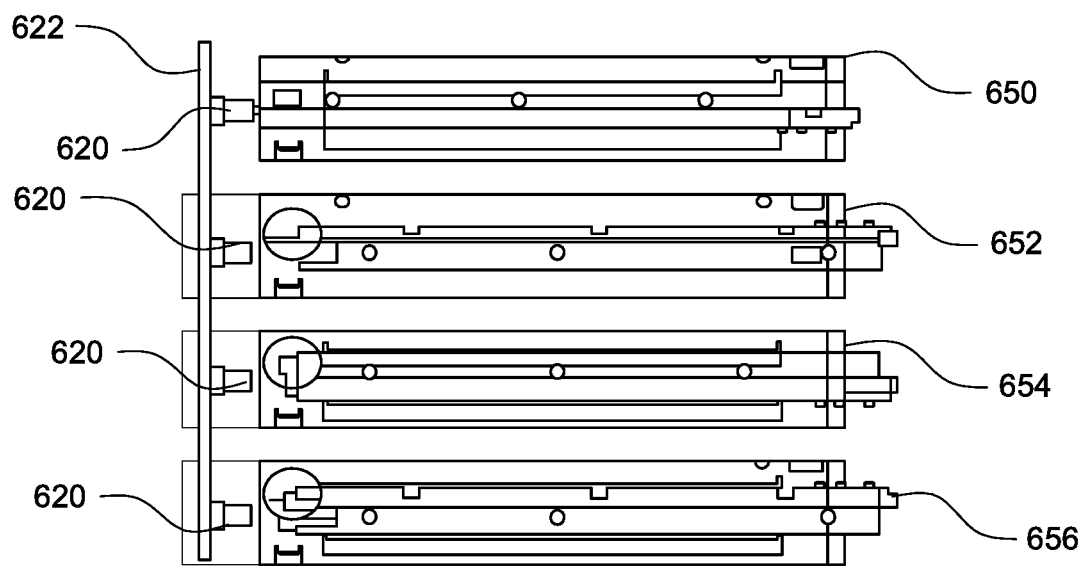
FIG. 6B is a top view of the server in FIG. 6A with different correct and incorrect insertions of the example common carriers in FIG. 2A.

FIG. 6A shows a perspective view of a server cage 600, and FIG. 6B shows a side view of the server cage 600. The server cage 600 may hold several of the example device modules that are assembled carriers and cards. For example, FIG. 6A shows two device modules that are carriers 602 and 604 and associated cards similar to the carrier 100 shown in FIGS. 2A-3B above. The server cage 600 has a top plate 610 and a bottom plate 612. The carriers 602 and 604 are placed between the top plate 610 and the bottom plate 612 from an insertion end 614. The connectors of the cards in the inserted carriers extend from the opposite end 616 of the cage. The card connectors may be attached to sockets 620 on a connection board 622 on the server as shown in FIG. 6B.

The bottom plate 612 includes a series of locking apertures 632 that are formed to accept the tab of the locking lever 160 shown in detail in FIGS. 3A-4B of each of the covers. A series of rail partitions 636 extend over the length of the bottom plate 612 to guide the respective carriers into the cage 600. The slots for each of the carrier and card modules are thus defined by the rail partitions 636.

The top plate 610 of the cage 600 includes a hard stop feature such as a hard stop projection 638 that is at the length of an E1S card, such as the E1S card 450 in FIG. 4B. Thus, a carrier with an E1S card when inserted in the cage 600 will be inserted to the proper position as defined by the hard stop projection 638. The bottom plate 612 includes a hard stop feature, such as a second hard stop projection 640 at the opposite end 616 that is set at the length of NF1 cards, such as the NF1 card 400 shown in FIG. 4A. Thus, a carrier with an NF1 card when inserted in the cage 600, will be inserted to the proper position as defined by the hard stop projection 640. The top of the cage 600 also includes a punch 650 for guiding the inserted carrier and limiting the space before golden finger connectors on the card is inserted into a corresponding connector from the server.

FIG. 6B shows a top view of the cage 600 in relation to the server connection board 622 that shows how the present mechanisms prevent the incorrect insertion of the cards. The cage 600 in this example includes four slots that can each accommodate one of the example carriers, such as the carrier 100 in FIG. 3A-3B, and an appropriate card. The first slot shows a carrier 650 that is inserted correctly. Thus, the card held by the carrier 650 is properly aligned so the card connector may be plugged into the socket 620 when the carrier 650 is inserted. The second slot shows a carrier 652 that is improperly inserted. Since the carrier 652 is improperly inserted, the card cannot be connected to the corresponding socket 620.

The third slot shows a carrier 654 that is holding an incorrect form factor card from the cards that are connectable to the server. In this example, the incorrect card will not be able to mate with the corresponding socket 620 when the carrier 654 is inserted in the slot. The fourth slot shows a carrier 656 that is both incorrectly inserted and holds the wrong type of card for the server. In this example, the card in the carrier 656 cannot be connected to the corresponding socket 620.

FIG. 7A shows a perspective partial cutaway view of the common carrier 100 showing the cooling of the card 102. FIG. 7B shows a cross section of the carrier 100 showing the cooling of the card 102. Like elements in FIGS. 7A-7B are labeled with identical identification numbers as like elements in FIGS. 2A-3B. As shown in FIG. 7A, the carrier 100 is positioned to receive a cooling air flow, as represented by arrows 700, from the proximal end 120. The arrows 700 show the cooling air flow that flows through the vents 142 in the edge 140 of the top cover 110. The cooling air is routed over the latching mechanism 122 and carried over the heat sink 112, and circulates hot air from the heat sink 112 as represented by arrows 702.

The card 102 is shown positioned between the top cover 110 and base module 114 in FIG. 7B. The side walls 132 and 134 of the top cover 110 overlap the respective side walls 152 and 154 of the base module 114 to enclose the card 102. The example carrier 100 is a thermally conductive material, such as metal, to assist in transmitting heat away from the card 102. The thermal pad 116 provides a thermal transmission path between the bottom of the card 102 and the bottom panel 150 of the base module 114. Heat represented by arrows 710 therefore is transmitted from the card 102 out through the bottom panel 150.

Heat generated by the card 102 also is thermally transmitted from the top of the card 102 to the heat sink 112. The thermal transmission between the card 102 and the heat sink 112 is assisted by a thermal pad 712, which is located between the card 102 and the bottom of the heat sink 112. The top surface of the heat sink 112 includes a series of vanes that assist in dissipating heat. The heat radiated from the top of the card 102 is represented by arrows 720.

The heat sink 112 serves to cool the example carrier 100 for an optimal thermal solution. A perspective view of the heat sink 112 in the example carrier 100 is shown in FIG. 8A. FIG. 8B shows a cross-section of the example heat sink 112. The heat sink 112 includes a top surface 810 and an opposite bottom surface 812. The bottom surface 812 is generally shaped to maximize contact with the card to maximize thermal conduction. As explained above, a thermal pad such as the thermal pad 712 may be provided between the card and the bottom surface 812 to assist in thermal conduction to the heat sink 112. The top surface 810 includes mounting holes 814 that may be used to position the heat sink 112 relative to the card. A series of vanes 820 are formed on the top surface 810 of the heat sink 112 to assist in dissipation of heat.

The heat sink 112 can be easily changed to provide a higher surface area for higher level cards with higher power consumption. Such cards may be introduced in the future and require greater thermal dissipation. The carrier 100 can be readily adapted to hold higher level cards with greater power consumption. An improved heat sink, such as a heat sink 850, may be provided for the example carrier 100 in FIG. 2A. The heat sink 850 includes a top surface 860 and corresponding opposite bottom surface 862. The bottom surface 862 is in thermal contact with the card. The top surface 860 includes a series of vanes 870 to assist in dissipation of heat. As shown in comparison to FIG. 8B, the vanes 870 in the heat sink 850 are relatively longer and therefore provide greater surface area to dissipate heat, thus allowing for cards that require higher thermal dissipation than that offered by the heat sink 112.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A carrier for a device card for installation in a server, the carrier comprising:
    a base module including side walls and a bottom panel having a plurality of registration features, wherein the plurality of registration features includes a first set of registration features corresponding to mating registration features of a first card of a plurality of different device cards and a second set of registration features corresponding to mating registration features of a second card of a plurality of different device cards;
    a top cover including side walls, wherein the first card of the plurality of different device cards is positioned between the side walls of the base module and the top cover, by mating the mating registration features of the first card with the first set of registration features, and wherein the second different type card of the plurality of different device cards is positioned between the side walls of the base module and the top cover by mating of the mating registration features of the second card with the second set of registration features; and
    a heat sink having a bottom surface in thermal contact with the cards and a top surface having a plurality of vanes, wherein the top cover includes an aperture to expose the top surface of the heat sink.

2. The carrier of claim 1 further comprising a latching mechanism on the bottom panel, the latching mechanism operable to lock the carrier to a server cage.

3. The carrier of claim 2, wherein the latching mechanism includes a lever having a tab, the lever operable between an unlocked position and a locked position that engages the tab with a server to lock the carrier in place.

4. The carrier of claim 2, wherein the top cover and base module have a proximal end and a distal end, wherein the latching mechanism is mounted on the proximal end, and wherein the device card has a connector extending from the distal end.

5. The carrier of claim 1, wherein the plurality of different device cards include a NF1 form factor card and an E1S form factor card.

6. The carrier of claim 1, wherein the side walls of the top cover include a peg that fits within a corresponding slot in the corresponding side walls of the base module.

7. The carrier of claim 1, wherein the top cover includes an edge that includes vents for air flow between the top cover and the base module.

8. The carrier of claim 1, wherein the registration features are pins that are located in different areas of the bottom panel, each of the pins corresponding to at least one hole in at least one of the plurality of different device cards.

9. A server including a plurality of device modules, the server comprising:
    a cage defining a plurality of module slots and a plurality of stop features corresponding to a plurality of different device cards;
    a board with sockets corresponding to each of the module slots; and
    a plurality of device modules inserted in the module slots, wherein each device module includes:
    a carrier including a base module having side walls, a bottom panel, a heat sink, and a top cover including side walls, wherein the bottom panel has a plurality of registration features, wherein the plurality of registration features includes a first set of registration features corresponding to mating registration features of a first card of a plurality of different device cards and a second set of registration features corresponding to mating registration features of a second card of a plurality of different device cards, wherein the heat sink has a bottom surface in thermal contact with the cards and a top surface having a plurality of vanes, and wherein the top cover includes an aperture to expose the top surface of the heat sink; and a device card selected from the plurality of different device cards positioned between the side walls of the base module and the top cover by mating a set of mating registration features of the device card with either first set of registration features or the second set of registration features, the device card including a connector connected to one of the sockets and the device card in contact with one of the plurality of stop features.

10. The server of claim 9, wherein each of the carriers further include a latching mechanism on the bottom panel, the latching mechanism operable to lock the carrier to one of the slots of the server cage.

11. The server of claim 10, wherein the latching mechanism includes a lever having a tab, the lever operable between an unlocked position and a locked position that engages the tab to a corresponding aperture to one of the slots of the server cage.

12. The server of claim 9, wherein the plurality of different device cards include a NF1 form factor card and an E1S form factor card.

13. The server of claim 9, wherein the top cover includes an edge that includes vents for air flow between the top cover and the base module.

14. The server of claim 9, wherein the registration features of each of the carriers are pins that are located in different areas of the bottom panel, each of the pins corresponding to at least one hole in at least one of the plurality of different device cards.

15. The server of claim 9, wherein the cage includes a top plate and a bottom plate, and wherein the modules are inserted between the top plate and the bottom plate.

16. The server of claim 15, wherein a plurality of rail partitions that define the slots for the modules are formed on the bottom plate.

17. A device module for insertion in a server cage, the module comprising:

a carrier including a base module having side walls, a bottom panel, a heat sink, and a top cover including side walls, wherein the bottom panel has a plurality of registration features, wherein the plurality of registration features includes a first set of registration features corresponding to mating registration features of a first card of a plurality of different device cards and a second set of registration features corresponding to mating registration features of a second card of a plurality of different device cards, wherein the heat sink has a bottom surface in thermal contact with the cards and a top surface having a plurality of vanes, and wherein the top cover includes an aperture to expose the top surface of the heat sink; and a device card selected from the plurality of different device cards positioned between the side walls of the base module and the top cover by mating a set of registration features of the device card with either the first set of registration features or the second set of registration features, the device card including a connector extending from a distal end of the carrier.

* * * * *